US011924961B2

(12) United States Patent
Lin et al.

(10) Patent No.: US 11,924,961 B2
(45) Date of Patent: Mar. 5, 2024

(54) CIRCUIT BOARD AND METHOD OF MANUFACTURING THE SAME

(71) Applicant: Unimicron Technology Corp., Taoyuan (TW)

(72) Inventors: Ai Jing Lin, Taoyuan (TW); Chung-Yu Lan, Taipei (TW); Jia Hao Liang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 161 days.

(21) Appl. No.: 17/661,284

(22) Filed: Apr. 28, 2022

(65) Prior Publication Data

US 2023/0292428 A1 Sep. 14, 2023

(30) Foreign Application Priority Data

Mar. 11, 2022 (TW) .................................. 111108960

(51) Int. Cl.
*H05K 1/02* (2006.01)
*H05K 1/11* (2006.01)
*H05K 3/00* (2006.01)

(52) U.S. Cl.
CPC .......... *H05K 1/0204* (2013.01); *H05K 1/115* (2013.01); *H05K 3/0061* (2013.01); *H05K 2201/09509* (2013.01); *H05K 2201/10416* (2013.01)

(58) Field of Classification Search
CPC .................................................. H05K 1/0204
See application file for complete search history.

(56) References Cited

U.S. PATENT DOCUMENTS

| 10,772,217 | B1* | 9/2020 | Gao | H05K 3/4069 |
| 2009/0250248 | A1* | 10/2009 | Kan | H01L 23/3735 29/846 |
| 2017/0280552 | A1* | 9/2017 | Wiesa | H01L 23/367 |
| 2018/0212129 | A1* | 7/2018 | Saito | H05K 1/02 |
| 2019/0223298 | A1* | 7/2019 | Silvano De Sousa | H05K 1/0353 |

FOREIGN PATENT DOCUMENTS

| CN | 107708296 A | 2/2018 |
| TW | M610519 U | 4/2021 |

OTHER PUBLICATIONS

Wang, Tse-Wei, "Circuit Board Enhancing Structure and Manufacture Method Thereof", Taiwanese patent Application No. 110126309, Filed on Jul. 16, 2021.

* cited by examiner

*Primary Examiner* — Sherman Ng
(74) *Attorney, Agent, or Firm* — CKC & Partners Co., LLC

(57) ABSTRACT

A circuit board includes a conductive metal layer, at least one insulating layer, at least one thermally conductive insulating layer and a heat dissipation element. The conductive metal layer is mainly used to transmit electronic signals. The insulating layer is connected to the conductive metal layer. The thermally conductive insulating layer is sandwiched between the conductive metal layer and the insulating layer, and thermally contacts the conductive metal layer, and is used for thermally conducting the heat of the conductive metal layer. The heat dissipation element is in thermal contact with the thermally conductive insulating layer, and is used to conduct the heat of the thermally conductive insulating layer to the outside through a heat dissipation channel.

9 Claims, 14 Drawing Sheets

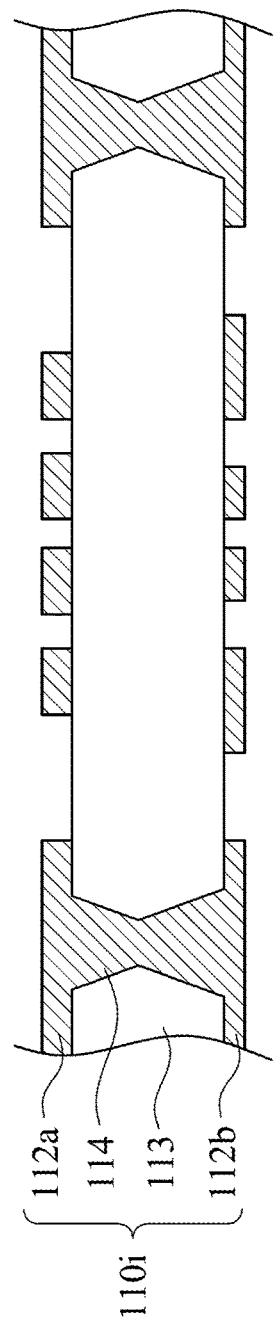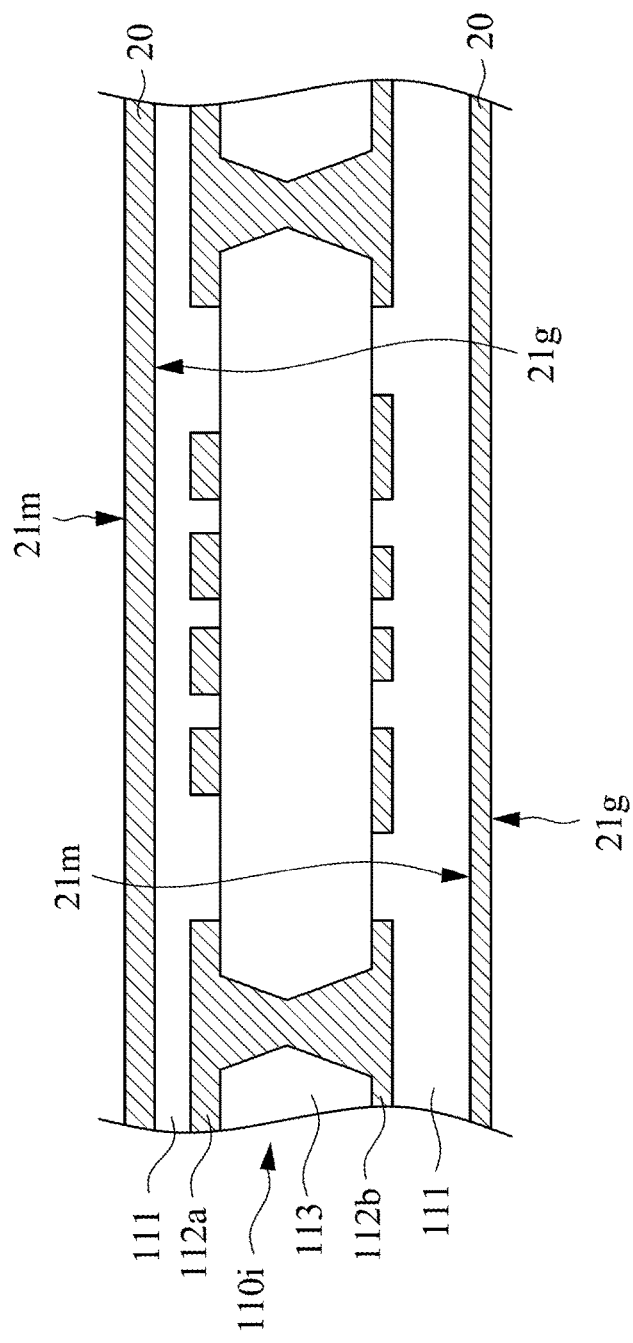

CIRCUIT BOARD AND METHOD OF MANUFACTURING THE SAME

CROSS-REFERENCE TO RELATED APPLICATION

This application claims priority to Taiwan Application Serial Number 111108960, filed Mar. 11, 2022, which is herein incorporated by reference in its entirety.

BACKGROUND

Technical Field

The present disclosure relates to a circuit board and a method of manufacturing the same. More particularly, the present disclosure relates to a circuit board including a thermally conductive insulating layer and a manufacturing method thereof.

Description of Related Art

Conventional electronic devices, such as smart phones and computers, have circuit boards and electronic components, e.g., integrated circuits (ICs), mounted on the circuit boards. When the electronic device is in operation, the electronic components will generate huge heat to result in the heat accumulation in circuits, thereby making the electronic device overheat and thus reducing the efficacy of the electronic device.

SUMMARY

At least one embodiment of the disclosure provides a circuit board, which uses a thermally conductive insulating layer to solve the issues due to the heat accumulation in the circuits.

At least one embodiment of the disclosure further provides a method of manufacturing the above circuit board including the thermally conductive insulating layer.

A circuit board according to at least one embodiment of the disclosure includes a conductive metal layer, at least one insulating layer, at least one thermally conductive insulating layer and a heat dissipation element. The conductive metal layer is mainly configured to transmit an electronic signal. The insulating layer is connected to the conductive metal layer. The thermally conductive insulating layer is sandwiched between the conductive metal layer and the insulating layer, and thermally contacts the conductive metal layer for conducting the heat of the conductive metal layer. The heat dissipation element thermally contacts the thermally conductive insulating layer for conducting the heat of the thermally conductive insulating layer to the outside through a heat dissipation channel.

A method of manufacturing a circuit board according to at least one embodiment of the disclosure includes a substrate having a supporting plane is formed. Next, a thermally conductive insulating layer is formed on the supporting plane. Next, a conductive metal layer is formed on the supporting plane, in which the conductive metal layer thermally contacts the thermally conductive insulating layer.

Based on the above, by using the thermally conductive insulating layer, the current issues due to the heat accumulation in circuits can be solved, so that the heat of an electronic component can dissipate quickly and not accumulate, thereby improving the efficacy of the electronic component and causing no the heat accumulation in the circuits to occur in the circuit board of the invention.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 2A to 2I are schematic cross-sectional views of a method of manufacturing the circuit board in FIG. 1.

DETAILED DESCRIPTION

Figure 1:
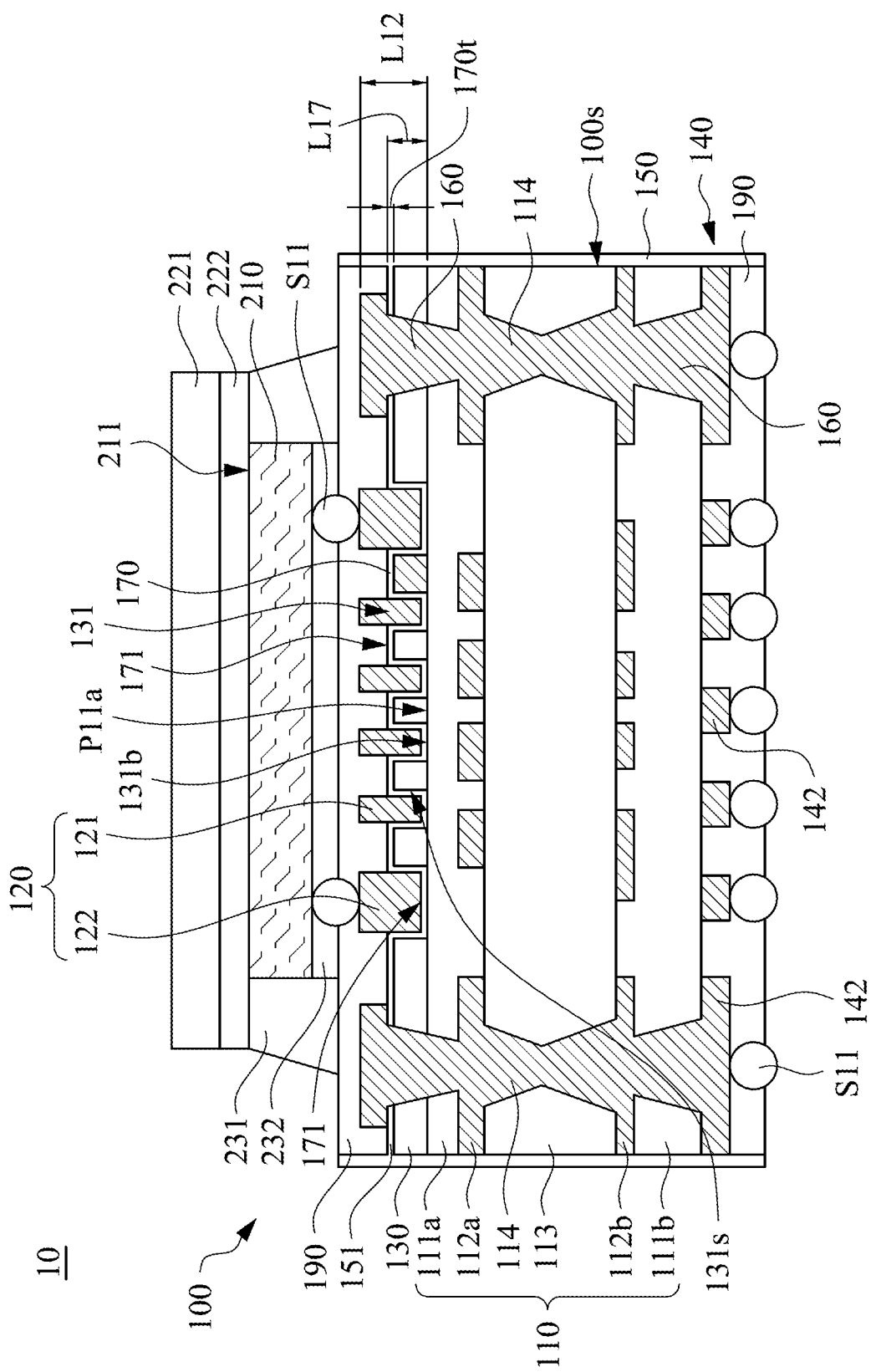
FIG. 1 is a schematic cross-sectional view of a circuit board assembly including a circuit board of at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions, and the quantity of some elements will be reduced. Accordingly, the description and explanation of the following embodiments are not limited to the quantity, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

FIG. 1 is a schematic cross-sectional view of a circuit board assembly including a circuit board of at least one embodiment of this disclosure. Referring to FIG. 1, a circuit board assembly 10 includes a circuit board 100 of the embodiment and an electronic component 210, in which the electronic component 210 is mounted on the circuit board 100. The electronic component 210 can be a packaged chip or an unpackaged die, so the circuit board assembly 10 can be a chip package or a printed circuit board assembly (PCBA).

The circuit board 100 includes a unit substrate 110 and an insulating layer 130, in which the unit substrate 110 includes an insulating layer 111a, and the insulating layer 111a has a supporting plane P11a and may be a dielectric layer, an insulating pattern layer or an insulating protective layer. The insulating layer 130 is disposed on the supporting plane P11a and has a plurality of trenches 131, in which each of the trenches 131 extends to the supporting plane P11a. That is to say, each of the trenches 131 is formed by etching through the insulating layer 130. In addition, the roughness of the supporting plane P11a is significantly low. For example, the root mean square roughness (Rq) of the supporting plane P11a is less than or equal to 0.1 μm, so the supporting plane P11a basically is smooth surface.

The circuit board 100 further includes at least one thermally conductive insulating layer 170, in which the thermally conductive insulating layer 170 is disposed on the supporting plane P11a and covers the insulating layer 130. The thermally conductive insulating layer 170 extends from the trenches 131 to the supporting plane P11a and covers the sidewall 131s and bottom 131b of each of the trenches 131 completely. Taking for FIG. 1 for example, the thermally conductive insulating layer 170 can cover all surfaces of each of the trenches 131 completely. In addition, since each of the trenches 131 extends to the supporting plane P11a, the thermally conductive insulating layer 170 can cover and touch the part of the supporting plane P11a, as shown in FIG. 1.

Since the roughness of the supporting plane P11a is significantly low (i.e., Rq is less than or equal to 0.1 μm), the thermally conductive insulating layer 170 is basically formed on the smooth supporting plane P11a. Hence, the thermally conductive insulating layer 170 also can have an upper surface 171 with low roughness. Especially, the part of the upper surface 171 in direct contact with the supporting plane P11a is basically a smooth surface, too.

The thermally conductive insulating layer 170 may be made of an inorganic material. In the embodiment, the thermally conductive insulating layer 170 can be a nitride layer or a carbide layer. For example, the material of the thermally conductive insulating layer 170 can be aluminum nitride, silicon carbide or boron nitride. The thermally conductive insulating layer 170 can be formed by physical vapor deposition (PVD) that may be sputtering or evaporation. In addition, the thickness 170t of the thermally conductive insulating layer 170 can range between 0.2 and 0.4 μm, while the thermal conductivity of the thermally conductive insulating layer 170 can range between 300 W/mK (i.e., $W \cdot m^{-1} \cdot K^{-1}$) and 450 W/mK, so the thermally conductive insulating layer 170 has a good capability of conducting heat.

The circuit board 100 further includes a conductive metal layer 120, where the conductive metal layer 120 is disposed on the thermally conductive insulating layer 170 and fills the trenches 131, and the insulating layers 130 and 111a are connected to the conductive metal layer 120. Specifically, the conductive metal layer 120 is mainly configured to transmit an electronic signal and can include a plurality of traces 121 and a plurality of pads 122, in which the traces 121 and the pads 122 are disposed in the trenches 131 respectively. The heights L12 of each trace 121 and each pad 122 relative to the supporting plane P11a can be substantially equal to each other and greater than the height L17 of the thermally conductive insulating layer 170 relative to the supporting plane P11a. Hence, the height (e.g., height L12) of the conductive metal layer 120 relative to the supporting plane P11a is greater than the heights L17 of the thermally conductive insulating layer 170 relative to the supporting plane P11a. In other words, each trace 121 and each pad 122 both protrude from the upper surface 171 of the thermally conductive insulating layer 170 entirely. In addition, the thermally conductive insulating layer 170 sandwiched between the conductive metal layer 120 and the insulating layer 130 thermally contacts the conductive metal layer 120 for conducting the heat of the conductive metal layer 120, where the thermally conductive insulating layer 170 can thermally contact at least one part of the side surface of the conductive metal layer 120, as shown in FIG. 1.

The pads 122 can be used for mounting the electronic component 210. For example, in the embodiment, the electronic component 210 can be mounted on the pads 122 by flip chip via solder balls S11. Alternatively, in other embodiment, the electronic component 210 can be mounted on the pads 122 by wire-bonding. Thus, the electronic component 210 in FIG. 1 is not limited to being mounted on the pads 122 by flip chip.

Since the thermally conductive insulating layer 170 has the upper surface 171 with low roughness, the conductive metal layer 120 filling the trenches 131 also has a surface with low roughness. Especially, the conductive metal layer 120 has the bottoms with low roughness at the bottoms 131b of the trenches 131, so as to reduce the signal loss which is caused by skin effect, thereby improving the signal transmission quality of the circuit board 100.

Moreover, since the heights L12 of each trace 121 and each pad 122 relative to the supporting plane P11a are greater than the height L17 of the thermally conductive insulating layer 170 relative to the supporting plane P11a, the bottoms and the parts of side surfaces of both each trace 121 and each pad 122 are covered by the thermally conductive insulating layer 170 and the insulating layer 130, so that the insulating layer 130 can wrap the bottoms of both the traces 121 and the pads 122. Accordingly, at least one of part of the conductive metal layer 120 can be embedded in the insulating layer 130, so as to enhance the bonding strength between the conductive metal layer 120 and the insulating layer 130 to reduce or to avoid the risk of peeling off traces.

The thermal conductivity of the thermally conductive insulating layer 170 can range between 300 W/mK and 450 W/mK, so the thermally conductive insulating layer 170 has a good capability of conducting heat. Thus, when the circuit board assembly 10 is powered and in operation, the thermally conductive insulating layer 170 will transfer the heat generated from the electronic component 210 and the conductive metal layer 120 quickly to avoid the heat accumulating in the circuit board assembly 10. Hence, the thermally conductive insulating layer 170 can help to suspend an increase in the temperature of the electronic component 210 to prevent the electronic component 210 from overheating, thereby improving the efficacy and the lifespan of the electronic component 210.

The circuit board 100 can further include a heat dissipation element 150, where the heat dissipation element 150 is disposed on the lateral side 100s of the circuit board 100 and surrounds the unit substrate 110, the insulating layer 130, the thermally conductive insulating layer 170 and the conductive metal layer 120. The material and the formation of the heat dissipation element 150 can be the same as the material and the formation of the thermally conductive insulating layer 170. For example, the heat dissipation element 150 can be a nitride layer or a carbide layer and be formed by sputtering or evaporation.

The heat dissipation element 150 thermally contacts the thermally conductive insulating layer 170 for conducting the heat of the thermally conductive insulating layer 170 to the outside through the heat dissipation channel 151, so that the thermally conductive insulating layer 170 also can transfer the heat to the heat dissipation element 150 quickly. Accordingly, the heat dissipation element 150 on the lateral side 100s can dissipate the heat to the outside to avoid the heat accumulation in the circuit board assembly 10, thereby solving the current issue due to the heat accumulation in the circuits, thereby suspending the increase in the temperature of the electronic component 210 effectively. In addition, the heat dissipation channel 151 may be a third heat dissipating insulating layer, and the heat dissipation element 150 may be a second heat dissipating insulating layer.

It is worth mentioning that in other embodiment, the circuit board 100 can include no heat dissipation element 150, and the lateral side 100s of the circuit board 100 can expose the part of the thermally conductive insulating layer 170. Specifically, the thermally conductive insulating layer 170 can extend to at least one lateral side 100s of the circuit board 100. For example, the circuit board 100 can have four lateral sides 100s, and the thermally conductive insulating layer 170 can extend to one of the lateral sides 100s of the circuit board 100 or all of the lateral sides 100s. Thus, the heat generated by the electronic component 210 and the conductive metal layer 120 can be transferred to the lateral side 100s, so as to suspend the increase in the temperature of the electronic component 210.

In addition, in the embodiment shown in FIG. 1, the unit substrate 110 may be a circuit substrate. Specifically, the unit substrate 110 can further include a core layer 113 and two conductive metal layers 112a and 112b, where the two conductive metal layers 112a and 112b are disposed on two opposite sides of the core layer 113, so that the core layer 113 is located between the conductive metal layers 112a and 112b.

The unit substrate 110 can further include at least one conductive column 114. Taking FIG. 1 for example, the unit substrate 110 includes a plurality of conductive columns 114, in which the conductive columns 114 are all located in the core layer 113 and connected to the conductive metal layers 112a and 112b, so that the conductive metal layers 112a and 112b can be electrically connected to each other through the conductive columns 114. In addition, the conductive columns 114 can be formed by laser drilling and electroplating, where a single conductive column 114 can be formed by connecting two conductive blind via structures. Hence, each of the conductive columns 114 can take the shape of an hourglass. That is to say, each of the conductive columns 114 has an uneven diameter, in which two ends of the conductive column 114 has a maximum diameter apiece, and the middle part of the conductive column 114 has a minimum diameter.

The circuit board 100 can further include an insulating layer 111b. The insulating layers 111a and 111b are disposed on two opposite sides of the core layer 113 respectively, so that the core layer 113 is located between the insulating layers 111a and 111b, in which the insulating layers 111a and 111b cover the conductive metal layers 112a and 112b respectively. Moreover, the circuit board 100 can further include a conductive metal layer 140, in which the conductive metal layer 140 is disposed and adjacent to the insulating layer 111b, and the insulating layers 111a and 111b are all located between the conductive metal layers 120 and 140. In addition, the thermally conductive insulating layer 170 is formed on a surface of the conductive metal layer 140 facing the core layer 120.

The circuit board 100 can further include a plurality of conductive blind via structures 160, where the conductive blind via structures 160 in the insulating layers 111a, 111b and 130. At least one of the conductive blind via structures 160 passes through the insulating layers 111a and 130 to be connected to the conductive metal layers 120 and 112a, so that the conductive metal layer 120 can be electrically connected to the conductive metal layer 112a via the conductive blind via structures 160. At least one of the other conductive blind via structures 160 passes through the insulating layer 111b to be connected to the conductive metal layers 140 and 112b, so that the conductive metal layer 140 can be electrically connected to the conductive metal layer 112b via the conductive blind via structures 160. Accordingly, singles (e.g., electric current signal) can be transmitted among the conductive metal layers 120, 112a, 112b and 140 by using the conductive blind via structures 160 and the conductive columns 114.

The circuit board 100 can further include two insulating protective layers 190, where the two insulating protective layers 190 partially cover the conductive metal layers 120 and 140 respectively. Specifically, the insulating protective layer 190 either incompletely covers or does not cover the pads 122 of the conductive metal layer 120 and the pads 142 of the conductive metal layer 140, so that the pads 122 can be electrically connected to the electronic component 210, and the pads 142 can be electrically connected to an external circuit board (not shown) by the solder balls S11. Thus, the electronic component 210 can be mounted on the circuit board 100, whereas the circuit board assembly 10 can be mounted on the external circuit board.

The circuit board assembly 10 can further include a molding compound 231 and a filling material 232, where the molding compound 231 is disposed on the conductive metal layer 120 and surrounds the electronic component 210. The molding compound 231 may be resin, such as epoxy. The filling material 232 is disposed in and fills a gap (not labeled) between the electronic component 210 and the insulating protective layer 190 which is adjacent to the previous electronic component 210.

The circuit board assembly 10 can further include a heat dissipation element 221, which is a heat dissipation sheet, for example. The heat dissipation element 221 can thermally contact the electronic component 210. Hence, the heat generated by the electronic component 210 can be not only transferred to the thermally conductive insulating layer 170 and the heat dissipation element 150 through the solder balls S11 and the conductive metal layer 120, but also transferred to the heat dissipation element 221, so that the heat dissipates from the thermally conductive insulating layer 170, the heat dissipation element 150 and the heat dissipation element 221 to the outside, so as to suspend the increase in the temperature of the electronic component 210 effectively, thereby improving the efficacy and the lifespan of the electronic component 210.

The circuit board assembly 10 can further include a thermally conductive material 222, which is thermal glue or thermal pad. The thermally conductive material 222 can be sandwiched between the electronic component 210 and the heat dissipation element 221 and in direct contact with the electronic component 210 and the heat dissipation element 221. Hence, the heat generated by the electronic component 210 and the conductive metal layer 120 can be transferred to the heat dissipation element 221 quickly and dissipate from the heat dissipation element 221 to the outside, so as to prevent the heat accumulation in circuits, thereby suspending the increase in the temperature of the electronic component 210.

The thermally conductive material 222 can directly touch the backside 211 of the electronic component 210, in which there is no pad set on the backside 211. Hence, the electric current signal cannot be transmitted from the backside 211 to the electronic component 210. Accordingly, the thermally conductive material 222 basically does not affect the current transmission inside the electronic component 210 directly. In addition, the thermally conductive material 222 also can be an electric insulator, so that not only the electronic component 210 cannot be electrically connected to the thermally conductive material 222, but also the electronic component 210 can further be electrically insulated from the thermally conductive material 222.

Figure 2C:
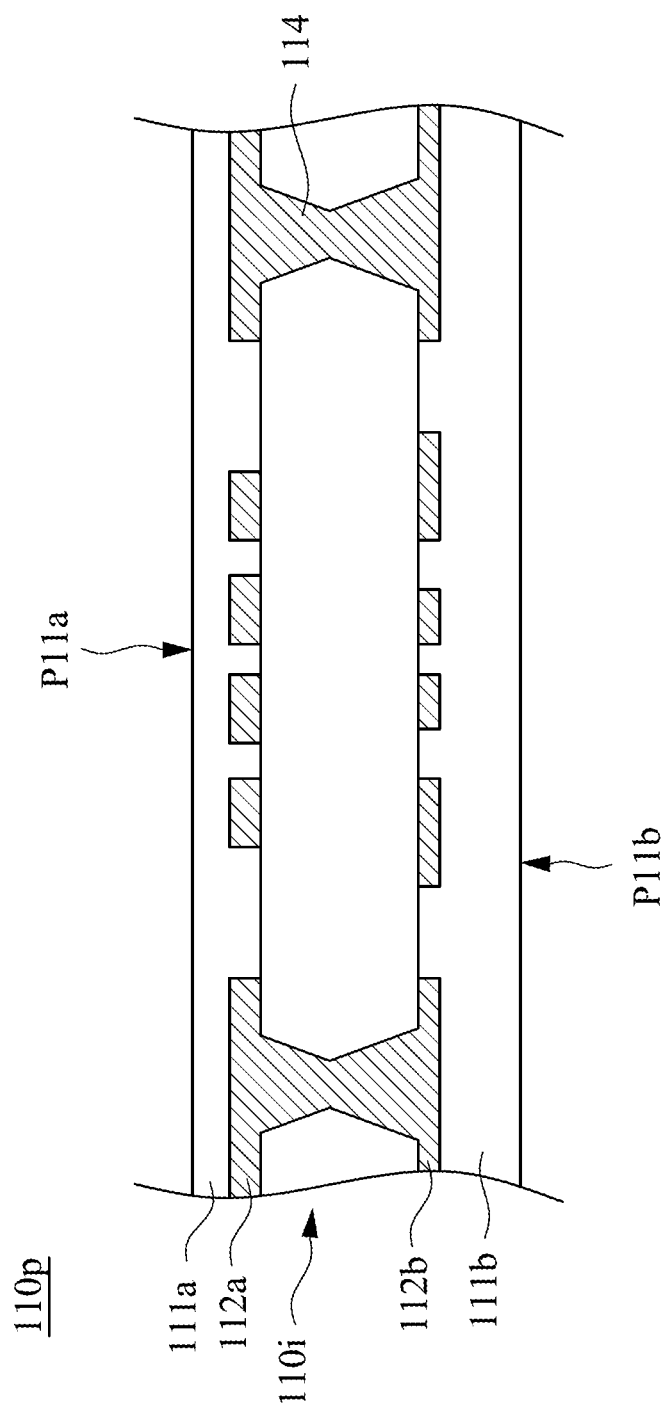

FIGS. 2A to 2I are schematic cross-sectional views of a method of manufacturing the circuit board in FIG. 1. Referring to FIG. 2A, in the manufacture of the circuit board 100, first, an initial substrate 110i can be provided, in which the initial substrate 110i will be diced in the subsequent process to form a plurality of unit substrates 110. Hence, the structure of the initial substrate 110i is substantially the same as or similar to the structure of the unit substrate 110.

The initial substrate 110i can be a circuit substrate and has at least one conductive metal layer. Taking FIG. 2A for example, the initial substrate 110i includes a core layer 113 and two conductive metal layers 112a and 112b, while the conductive metal layers 112a and 112b are disposed on two opposite sides of the core layer 113. The initial substrate 110i can further include a plurality of conductive columns 114 in the core layer 113, in which each of the conductive columns 114 is connected to the conductive metal layers 112a and 112b. The conductive columns 114 can be formed by drilling and electroplating, where the previous drilling can be laser drilling or mechanical drilling.

Referring to FIG. 2B, afterward, two insulating materials 111 are formed on the initial substrate 110i, where the insulating materials 111 are disposed on two opposite sides of the initial substrate 110i respectively and cover the conductive metal layers 112a and 112b respectively. Thus, the initial substrate 110i can be sandwich between the insulating materials 111. In addition, the insulating material 111 can include polymer material, such as resin, and the insulating material 111 can be a prepreg.

Afterward, the insulating material 111 is laminated with two metal coils 20, where the metal coil 20 is such as copper coil. The insulating material 111 can have stickiness, so the insulating materials 111 can be attached to the metal coils 20 respectively after the insulating material 111 is laminated with two metal coils 20. Each metal coil 20 has a glossy surface 21g and a matte surface 21m, where the roughness of the glossy surface 21g is less than that of the matte surface 21m, and the glossy surface 21g is opposite to the matte surface 21m in the same metal coil 20.

In the process of the lamination with the metal coils 20, the glossy surface 21g of one of the metal coils 20 faces the insulating material 111, so that after pressing the previous metal coil 20, the glossy surface 21g of the metal coil 20 can directly touch the insulating material 111, as the upper metal coil 20 shown in FIG. 2B. The matte surface 21m of the other metal coil 20 faces another insulating material 111, so that the matte surface 21m of the metal coil 20 directly touches the insulating material 111, as the lower metal coil 20 shown in FIG. 2B.

Referring to FIG. 2C, after the lamination with the metal coils 20, the insulating material 111 are cured, so as to form the insulating layers 111a and 111b. Afterward, the metal coils 20 are removed to expose the insulating layers 111a and 111b, where the removal of the metal coils 20 can be etching. Since the glossy surface 21g of the upper metal coil 20 in FIG. 2B can directly touch the insulating material 111, the insulating material 111 which directly touched the glossy surface 21g can form the insulating layer 111a having the supporting plane P11a with low roughness. The insulating material 111 which directly touched the matte surface 21m can form the insulating layer 111b having a rough surface P11b. After the metal coils 20 are removed, a substrate 110p including the insulating layers 111a, 111b and the initial substrate 110i is formed.

It is necessary to note that in the embodiment, the substrate 110p includes the insulating layers 111a and 111b. However, in other embodiment, the substrate 110p can only include the initial substrate 110i and one single insulating layer disposed on the initial substrate 110i. For example, the insulating layer 111b can be omitted from FIG. 2C. Moreover, the initial substrate 110i in the embodiment is a circuit substrate, but in other embodiment, the initial substrate 110i also can be a substrate without any conductive metal layer. Taking FIG. 2C for example, the conductive metal layers 112a, 112b and the conductive columns 114 in the initial substrate 110i can be omitted. Hence, FIGS. 2A to 2C do not limit the substrate 110p and the formation thereof.

Figure 2D:
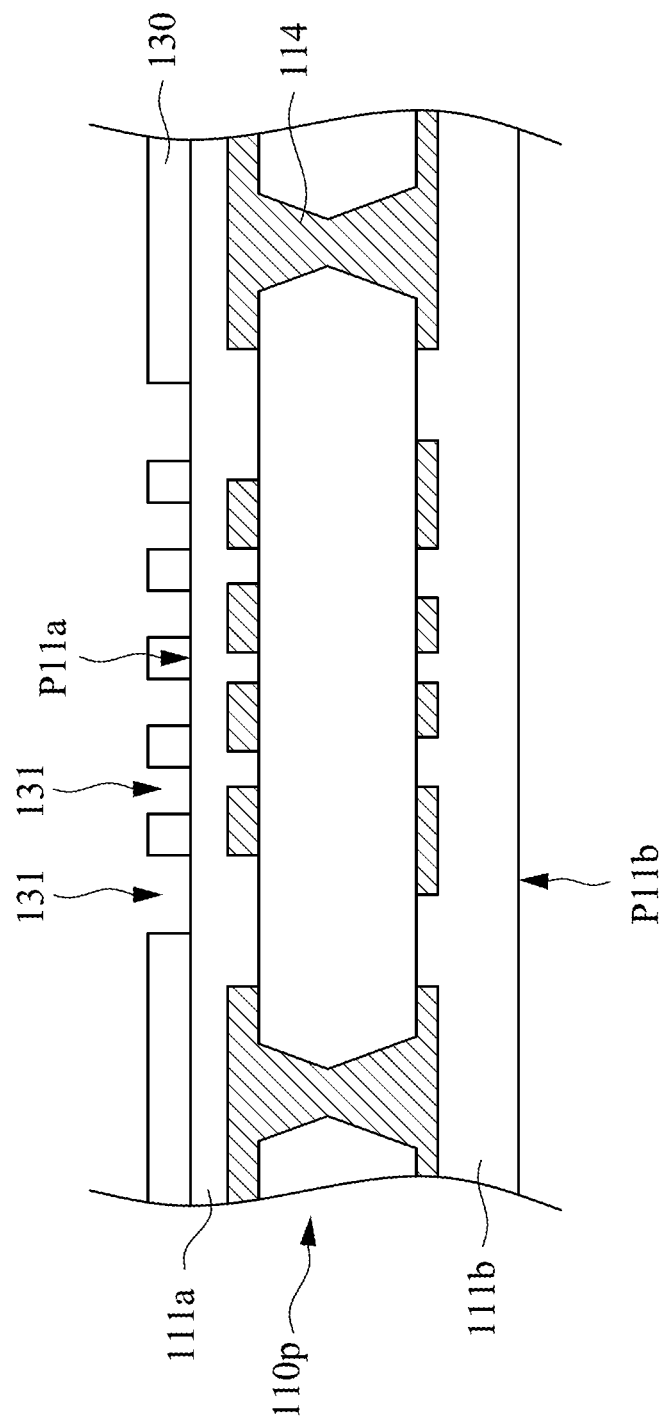

Referring to FIG. 2D, afterward, an insulating layer 130 is formed on the supporting plane P11a. The material of the insulating layer 130 is the photoimageable dielectric material, and the formation of the insulating layer 130 on the supporting plane P11a includes exposure and development. Specifically, in the step of forming the insulating layer 130, a photoimageable dielectric layer can be formed on the supporting plane P11a at first. Afterward, an exposure process is performed on the photoimageable dielectric layer. Next, a development process is performed on the photoimageable dielectric layer, so as to form the insulating layer 130 having the plurality of trenches 131, in which the trenches 131 is formed by exposure and development.

Figure 2E:
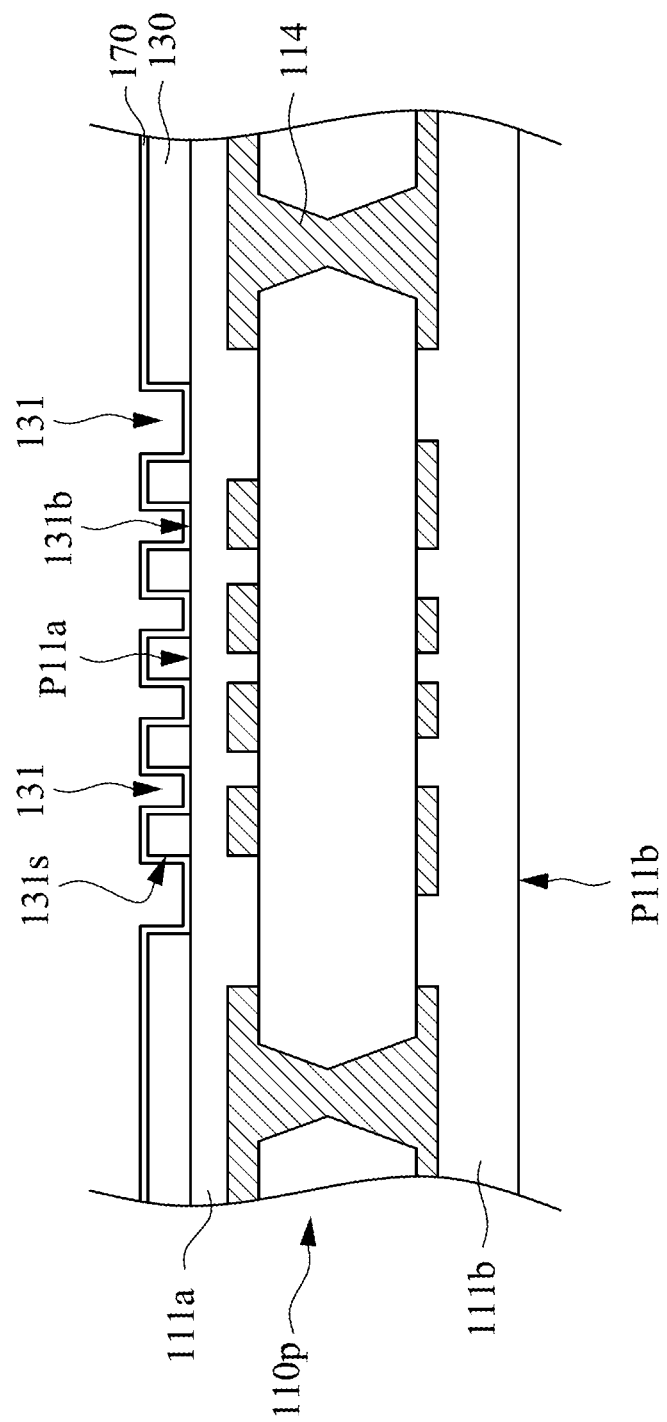

Referring to FIG. 2E, afterward, the thermally conductive insulating layer 170 is formed on the insulating layer 130 and the supporting plane P11a, where the thermally conductive insulating layer 170 can be formed by using PVD, such as sputtering or evaporation. The thermally conductive insulating layer 170 covers the insulating layer 130 and extends from the trenches 131 to the supporting plane P11a, where the thermally conductive insulating layer 170 completely covers the sidewall 131s and the bottom 131b of each of the trenches 131, and the thermally conductive insulating layer 170 can directly touch the insulating layer 130 and the supporting plane P11a.

Figure 2F:
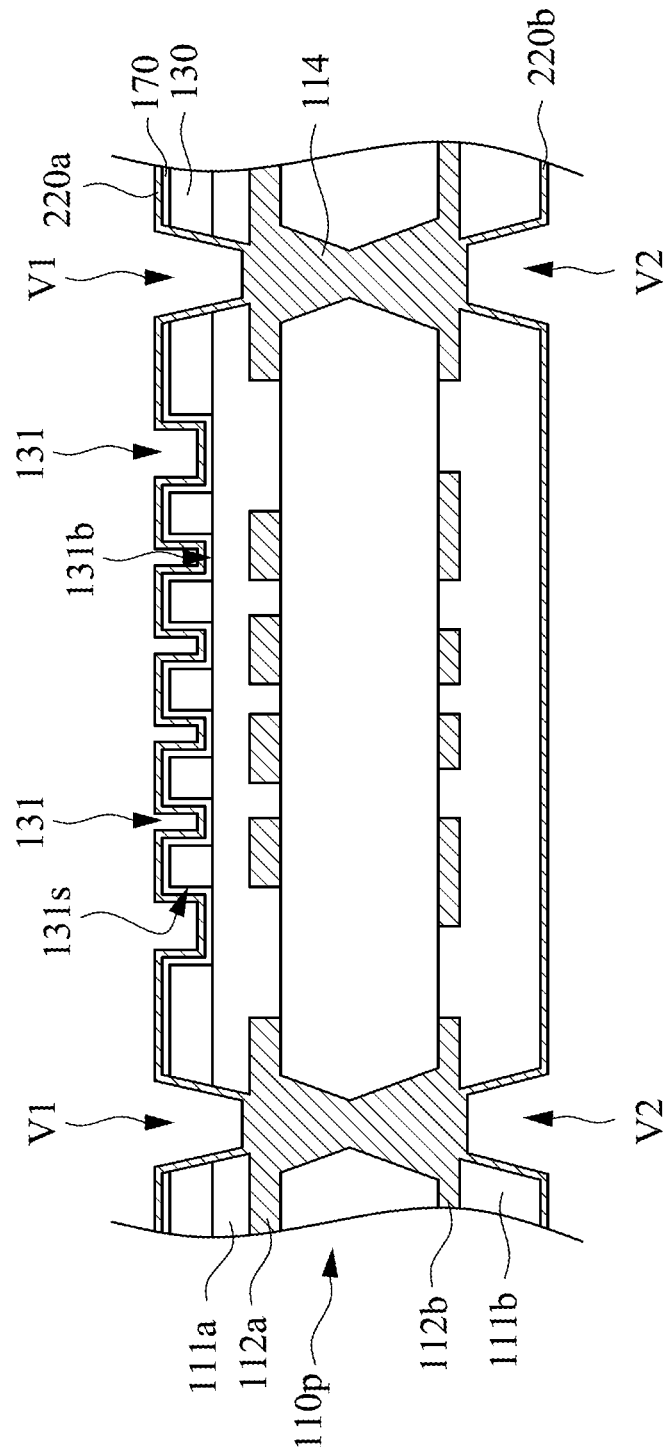

Referring to FIG. 2F, then, a metal seed layer 220a is formed on the thermally conductive insulating layer 170. The metal seed layer 220a completely covers the thermally conductive insulating layer 170, and the metal seed layer 220a further completely covers the part of the thermally conductive insulating layer 170 in the trenches 131. In addition, during the process of forming the metal seed layer 220a, another metal seed layer 220b can be formed on the insulating layer 111b, where the insulating layers 111a and 111b are all located between the metal seed layers 220a and 220b.

Figure 2G:
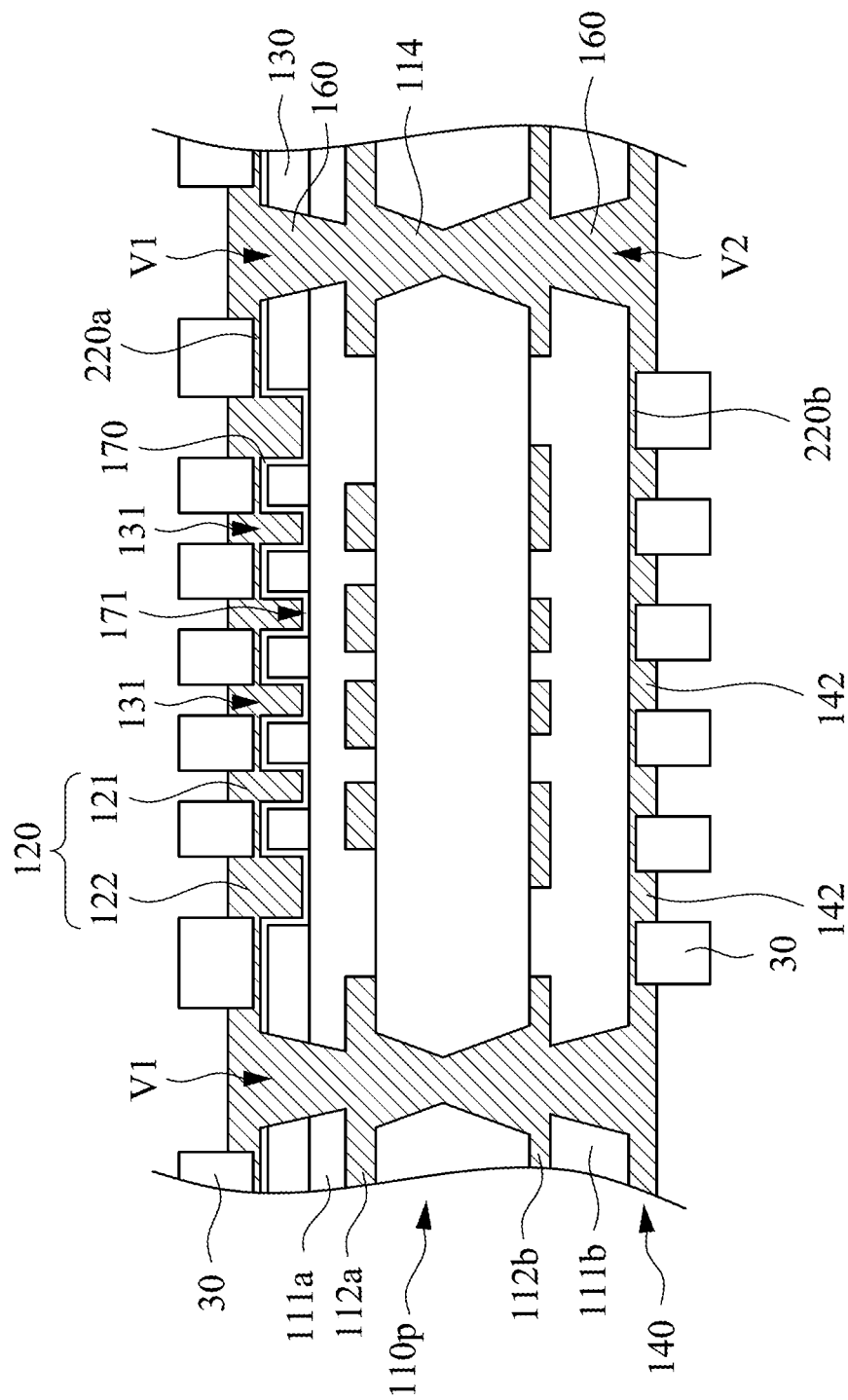

Referring to FIG. 2G, afterward, two masking layers 30 are formed on the metal seed layers 220a and 220b respectively. The masking layers 30 partially cover the metal seed layers 220a and 220b respectively. One masking layer 30 (e.g., the upper masking layer 30 in FIG. 2G) exposes the part of the metal seed layer 220a in the trenches 131. In the embodiment, the previous masking layer 30 can expose the part of the metal seed layer 220a overlapping the conductive blind via structures 160. The other masking layer 30 (e.g., the lower masking layer 30 in FIG. 2G) has a plurality of openings (not labeled), in which the openings expose the part of the metal seed layer 220b.

Figure 2H:
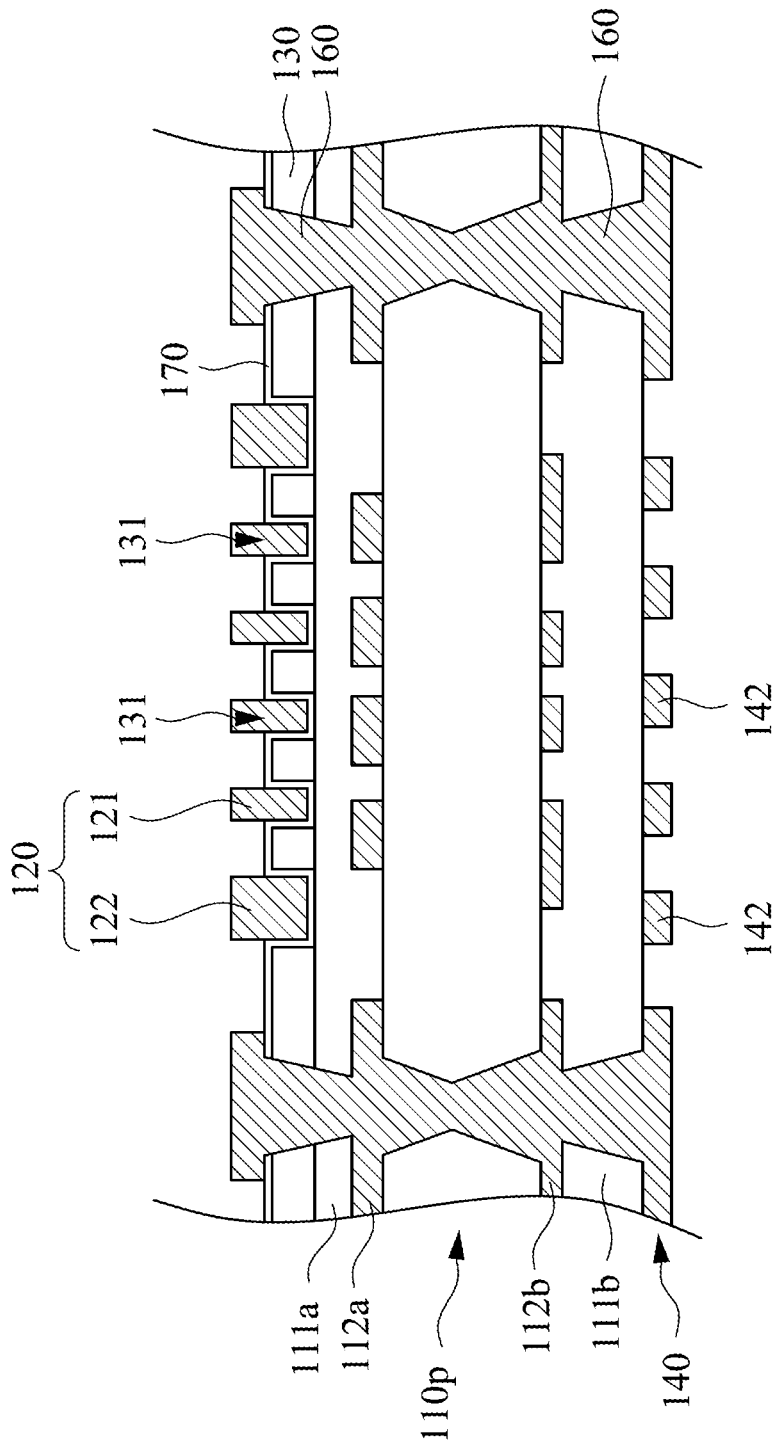

Referring to FIGS. 2G and 2H, afterward, electroplating is performed on the metal seed layers 220a and 220b, so as to form the conductive metal layer 120 on the upper surface 171 of the thermally conductive insulating layer 170 and on the supporting plane P11a, and the conductive metal layer 140 is formed on the lower surface of the insulating layer 111b. The thermally conductive insulating layer 170 is located between the conductive metal layer 120 and the substrate 110p. Afterward, the masking layers 30 and the part of the metal seed layers 220a and 220b covered by the masking layers 30 are removed, so that the traces 121 and the pads 122 of the conductive metal layer 120 are separated from each other, and the pads 142 of the conductive metal layer 140 are separated from each other, thereby avoiding short circuit.

Figure 2I:
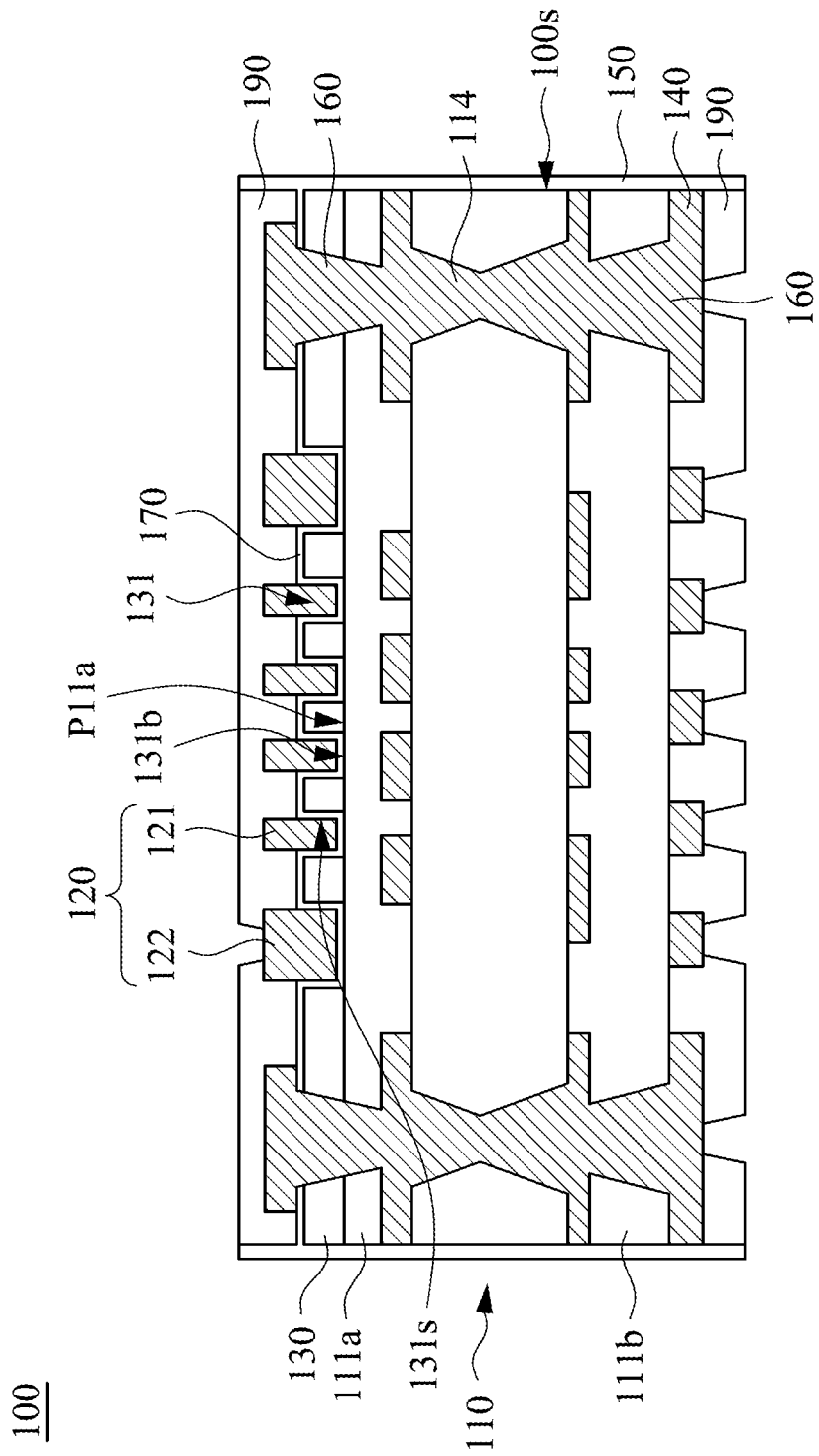

Referring to FIG. 2I, after the conductive metal layers 120 and 140 are formed, the insulating protective layers 190 can be formed on the conductive metal layers 120 and 140 respectively, where the insulating protective layers 190 can be solder masks. The insulating protective layers 190 can be solder mask defined (SMD) or non-solder mask defined (NSMD).

Taking FIGS. 1 and 2I for example, each of the insulating protective layers 190 is SMD, so the insulating protective layers 190 cover the part of each of the pads 122 and the part of each of the pads 142 and cover the pads 122 and 142 incompletely. Thus, the pads 122 and 142 can be electrically connected to the electronic component 210 and the external circuit board respectively. In other embodiment, each of the insulating protective layers 190 also can be NSMD, so that each of the insulating protective layers 190 may not cover any pads 122 and 142, i.e., the insulating protective layers 190 may not touch any pads 122 and 142.

Afterward, the substrate 110p can be diced to form a plurality of unit substrates 110. So far, the circuit board 100 is basically complete, where the lateral side 100s of the circuit board 100 is formed by the cutter dicing the substrate 110p. During dicing the substrate 110p, the thermally conductive insulating layer 170, the insulating layer 130, the conductive metal layers 120, 140 and the insulating protective layer 190 in the circuit board 100 are also diced, so that the lateral side 100s of the circuit board 100 can expose the part of the thermally conductive insulating layer 170, in which the surface (not labeled) of the thermally conductive insulating layer 170 exposed in the lateral side 100s can be flush with the lateral side of the unit substrate 110.

Each of the unit substrates 110 has the lateral side (not labeled) formed by dicing, where the lateral side 100s of one circuit board 100 includes the lateral side of the unit substrate 110. In other words, the lateral side of the unit substrate 110 is a part of the lateral side 100s. In addition, after the substrate 110p is diced, the heat dissipation element 150 is formed on the lateral side 100s (including the lateral side of the unit substrate 110), where the heat dissipation element 150 thermally contacts the thermally conductive insulating layer 170.

Since the materials and the formations of both the heat dissipation element 150 and the thermally conductive insulating layer 170 can be the same, the heat dissipation element 150 can be formed by PVD, such as sputtering or evaporation, and the heat dissipation element 150 can be the nitride layer or carbide layer. For example, the material of the heat dissipation element 150 can be aluminum nitride, silicon carbide or boron nitride.

It is worth mentioning that the circuit board 100 disclosed in the previous embodiment has four conductive metal layers, i.e., the conductive metal layers 112a, 112b, 120 and 140. However, since the initial substrate 110i (referring to FIG. 2A) can have no conductive metal layer, the quantity of the conductive metal layers which the circuit board 100 has can be only two, i.e., the conductive metal layers 112a and 112b can be omitted.

In addition, in FIG. 2C, the substrate 110p can only include the initial substrate 110i and the insulating layer 111a disposed on the initial substrate 110i, and the insulating layer 111b can be omitted. Moreover, the conductive metal layer 140 can be omitted, and the quantity of the conductive metal layer which the circuit board 100 has can be only one, i.e., the conductive metal layer 120, under the condition that the initial substrate 110i does not have any conductive metal layer. In other words, the circuit board 100 can be a single-layered circuit board, and FIGS. 1 and 2I do not limit the quantity of the conductive metal layer which the circuit board 100 has.

Figure 3A:
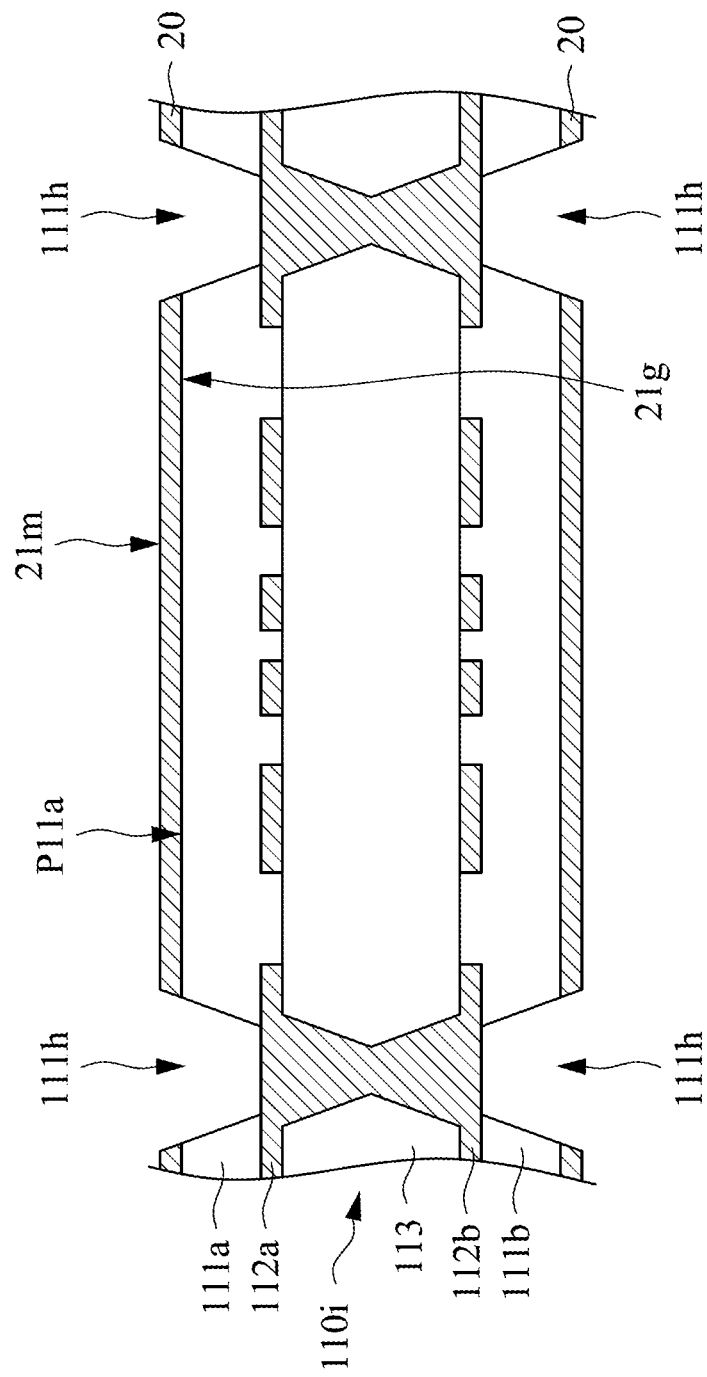
FIGS. 3A to 3E are schematic cross-sectional views of a method of manufacturing a circuit board according to at least one embodiment of this disclosure.
Figure 3B:
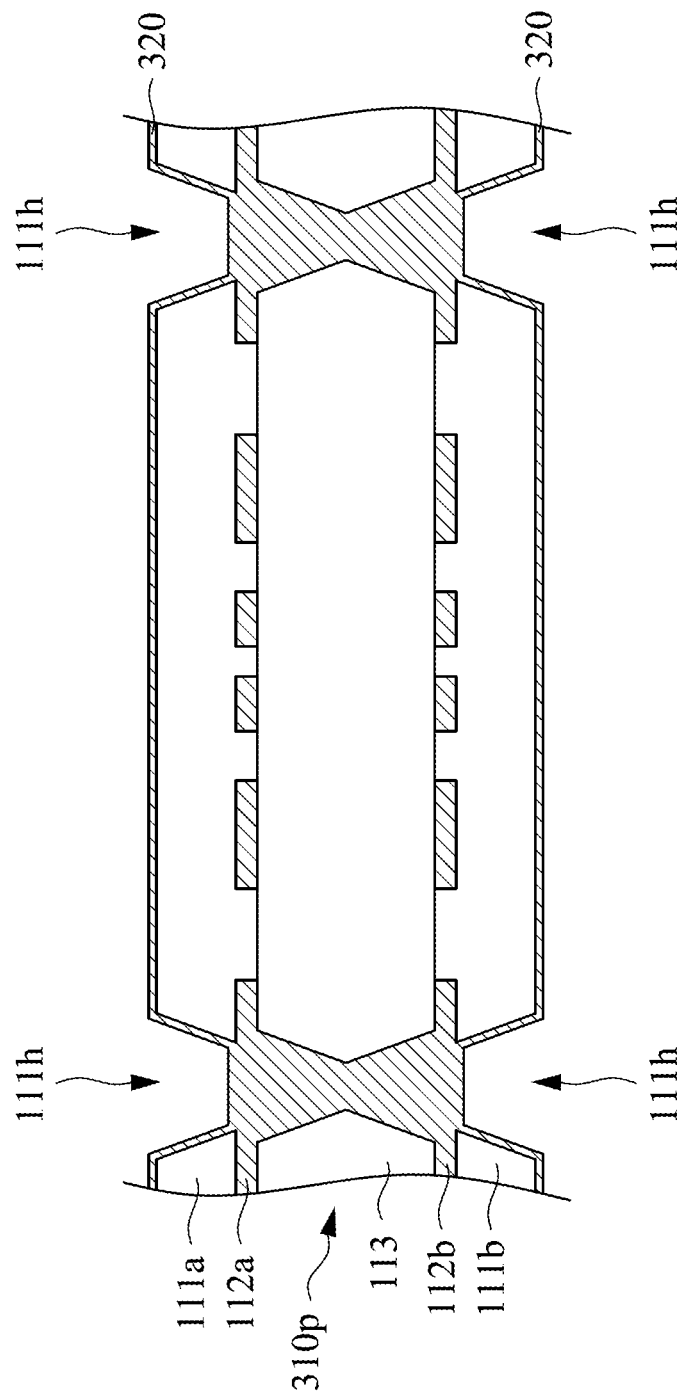
Figure 3C:
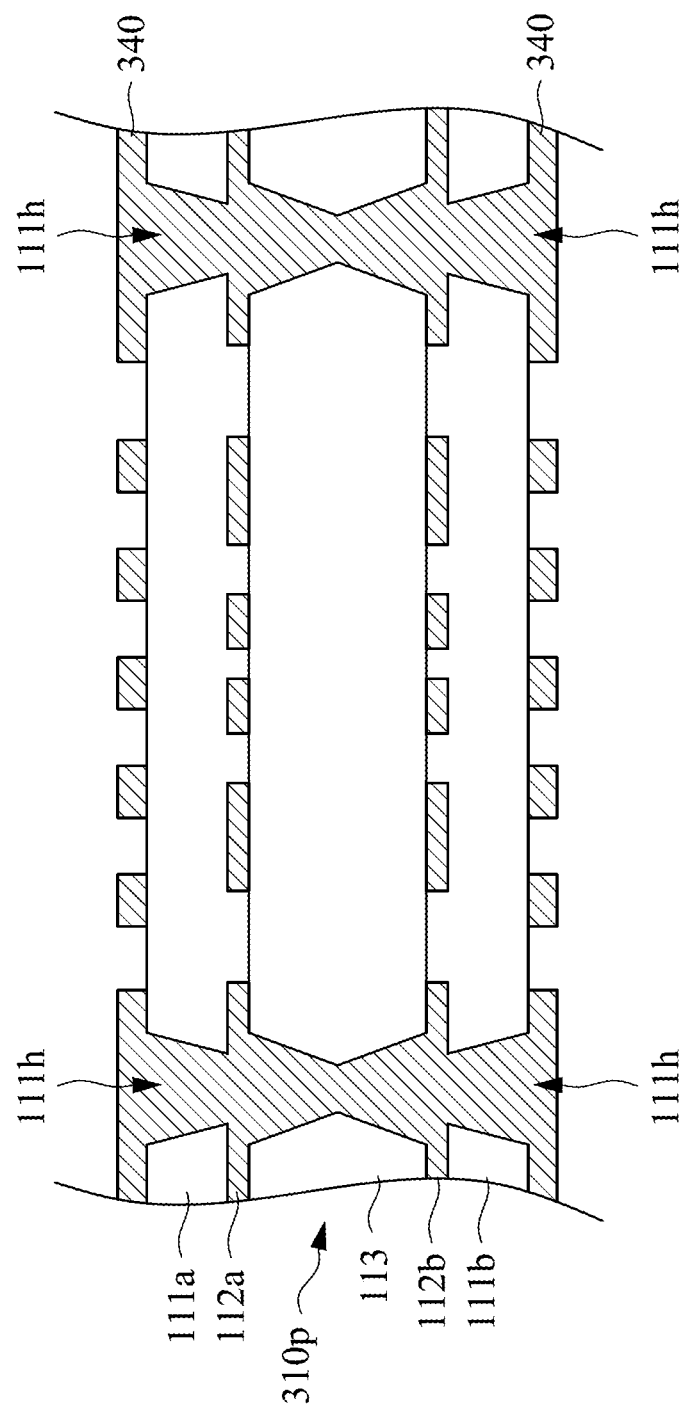
Figure 3D:
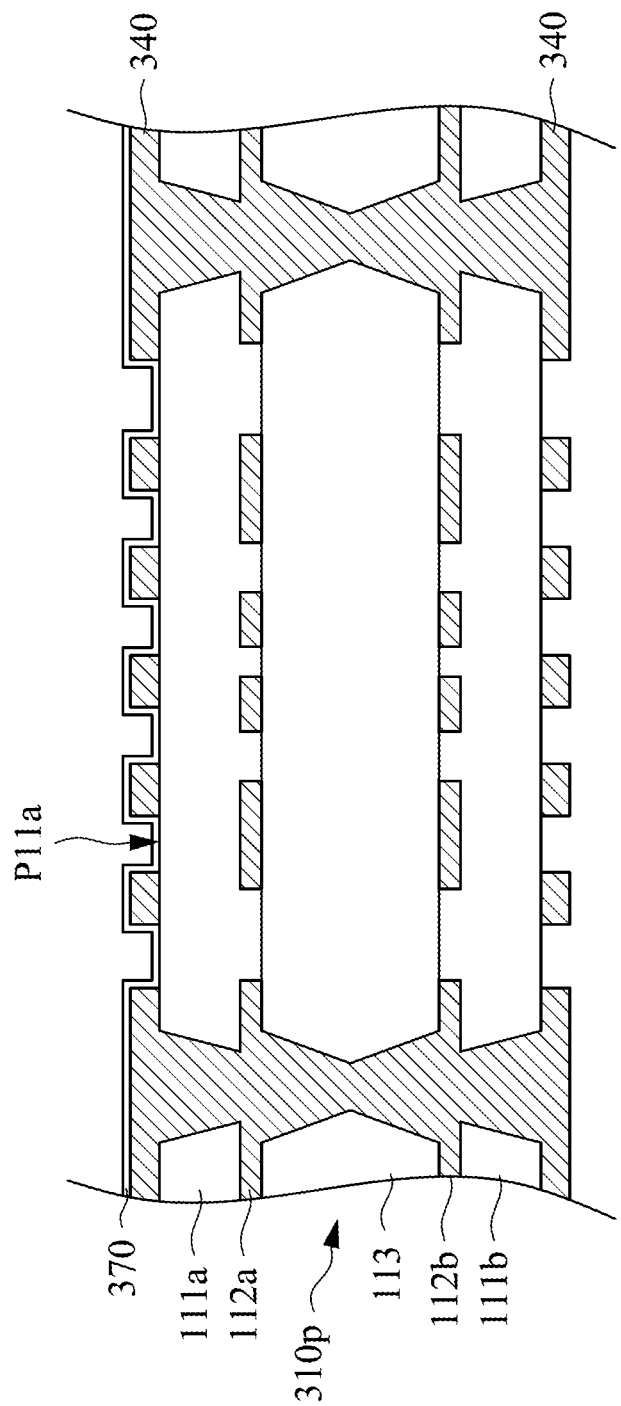
Figure 3E:
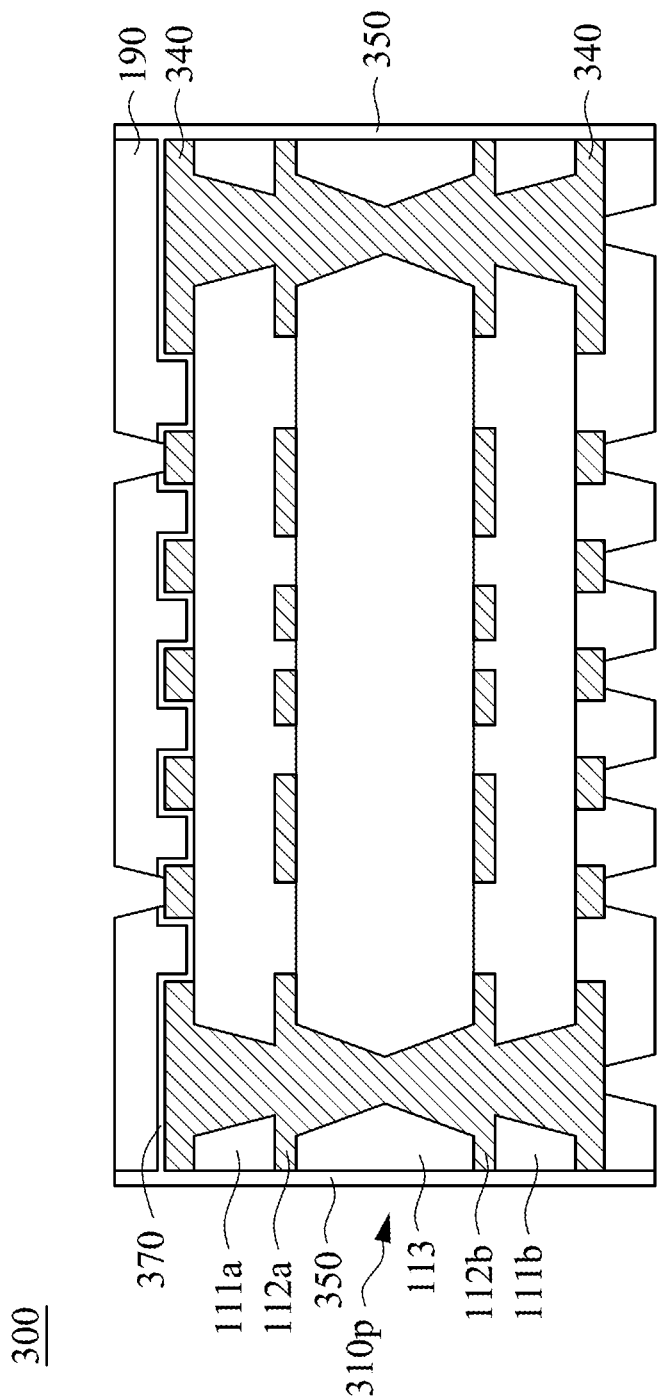

FIGS. 3A to 3E are schematic cross-sectional views of a method of manufacturing a circuit board according to at least one embodiment of this disclosure, where a circuit board 300 shown in FIG. 3E is similar to the circuit board 100 in the previous embodiment. Hence, the following description and FIGS. 3A to 3E only disclose the different features between the circuit boards 300 and 100 and do not repeat the same features.

Referring to FIG. 3A, after two insulating materials 111 are formed on the initial substrate 110i (referring to FIG. 2B), the insulating materials 111 can be laminated with two metal coils 20, such as copper coil, respectively, where the glossy surface 21g of one metal coil 20 directly touches the insulating material 111, like the upper metal coil 20 in FIG. 3A. Then, the insulating materials 111 are cured, so as to form the insulating layers 111a and 111b. Since the glossy surface 21g of the metal coil 20 directly touches the upper insulating material 111, the insulating layer 111a has the supporting plane P11a with low roughness. Then, a plurality of through holes 111h are formed in the metal coils 20, where the through holes 111h pass through the metal coils 20, the insulating layers 111a and 111b, but do not pass through the conductive metal layers 112a and 112b. In addition, the through holes 111h can be formed by laser drilling.

Referring to FIG. 3B, next, the metal coils 20 are removed to form the substrate 310p, where the removal of the metal coils 20 can be etching, and the substrate 310p includes the core layer 113, the insulating layers 111a and 111b, and the conductive metal layers 112a and 112b. Next, two metal seed layers 320 are formed on two opposite sides of the substrate 310p, where both of the metal seed layers 320 completely cover the insulating layers 111a and 111b and the sidewalls and the bottoms of the through holes 111h.

Referring to FIG. 3C, next, it is the same as the steps disclosed in FIGS. 2F to 2H that electroplating is performed on the metal seed layers 320 by using the masking layers 30 (not shown in FIG. 3C), so as to form at least two conductive metal layers 340, where the conductive metal layers 340 fill the through holes 111h. Next, the masking layers 30 and the part of the metal seed layers 320 covered by the masking layers 30 are removed, so as to avoid short circuit occurring in the conductive metal layer 340. Referring to FIG. 3D, next, a thermally conductive insulating layer 370 is formed on the supporting plane P11a of the insulating layer 111a, where the thermally conductive insulating layer 370 completely covers the upper conductive metal layer 340, and the conductive metal layer 340 is located between the thermally conductive insulating layers 370 and the substrate 310p. In addition, the materials and the formations of the thermally conductive insulating layers 370 and 170 are the same, thereby not repeating herein.

Referring to FIG. 3E, next, the insulating protective layers 190 are formed on both of the conductive metal layers 340 respectively, in which the insulating protective layer 190 can partially cover the conductive metal layer 340, not completely cover the conductive metal layer 340. Next, dicing can be performed. So far, the circuit board 300 is basically complete. After performing dicing, a heat dissipation element 350 can be formed on the lateral side of the circuit board 300, in which the heat dissipation element 350 may be a heat dissipating insulating layer, and the heat dissipation element 350 thermally contacts the thermally conductive insulating layer 370. The materials and the formations of the heat dissipation elements 350 and 150 are the same, thereby not repeating herein.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A circuit board, comprising:
   a conductive metal layer, mainly configured to transmit an electronic signal;
   at least one insulating layer, connected to the conductive metal layer;
   at least one thermally conductive insulating layer, sandwiched between the conductive metal layer and the insulating layer, and thermally contacting the conductive metal layer for conducting heat of the conductive metal layer;
   a heat dissipation element, thermally contacting the thermally conductive insulating layer for conducting heat of the thermally conductive insulating layer to an outside through a heat dissipation channel, wherein the heat dissipation element is disposed on a lateral side of the circuit board and surrounds the insulating layer, the thermally conductive insulating layer, and the conductive metal layer.

2. The circuit board of claim 1, wherein the insulating layer is a dielectric layer, an insulating pattern layer or an insulating protective layer.

3. The circuit board of claim 1, wherein the thermally conductive insulating layer is a nitride layer or a carbide layer.

4. The circuit board of claim 1, wherein a material of the thermally conductive insulating layer is aluminum nitride, silicon carbide or boron nitride.

5. The circuit board of claim 1, wherein the thermally conductive insulating layer thermally contacts at least one portion of a side of the conductive metal layer.

6. The circuit board of claim 1, wherein a material of the insulating layer is a photoimageable dielectric material.

7. The circuit board of claim 1, wherein the circuit board has a core layer, and the thermally conductive insulating layer is formed on a surface of the conductive metal layer facing the core layer.

8. The circuit board of claim 1, wherein the heat dissipation element is a second heat dissipating insulating layer.

9. The circuit board of claim 1, wherein the heat dissipation channel is third heat dissipating insulating layer.

* * * * *